(12) United States Patent
Beausoleil et al.

(10) Patent No.: US 7,107,203 B1
(45) Date of Patent: Sep. 12, 2006

(54) HIGH SPEED SOFTWARE DRIVEN EMULATOR COMPRISED OF A PLURALITY OF EMULATION PROCESSORS WITH IMPROVED BOARD-TO-BOARD INTERCONNECTION CABLE LENGTH IDENTIFICATION SYSTEM

(75) Inventors: William F. Beausoleil, Hopewell Junction, NY (US); R. Bryan Cook, Poughkeepsie, NY (US); Tak-kwong Ng, Hyde Park, NY (US); Helmut Roth, Hopewell Junction, NY (US); Peter Tannenbaum, Woodstock, NY (US); Lawrence A. Thomas, West Hurley, NY (US); Norton J. Tomassetti, Kingston, NY (US)

(73) Assignee: Quickturn Design Systems Inc., San Jose, CA (US)

(*) Notice: Subject to any disclaimer, the term of this patent is extended or adjusted under 35 U.S.C. 154(b) by 871 days.

(21) Appl. No.: 09/655,595

(22) Filed: Sep. 6, 2000

(51) Int. Cl.
  *G06F 9/455* (2006.01)
  *G06F 17/50* (2006.01)
(52) U.S. Cl. .................................. 703/28
(58) Field of Classification Search ............... 703/28; 716/5
See application file for complete search history.

(56) References Cited

U.S. PATENT DOCUMENTS

| | | | |
|---|---|---|---|
| 3,903,380 A * | 9/1975 | Schomburg | 324/66 |
| 4,100,721 A * | 7/1978 | Seiichi et al. | 57/294 |
| 4,104,582 A * | 8/1978 | Lambertsen | 324/533 |
| 4,380,931 A * | 4/1983 | Frost et al. | 73/643 |
| 4,797,604 A * | 1/1989 | Rocci et al. | 324/699 |
| 5,157,665 A * | 10/1992 | Fakhraie-Fard et al. | 714/712 |
| 5,226,047 A * | 7/1993 | Catlin | 714/28 |
| 5,352,123 A * | 10/1994 | Sample et al. | 439/61 |
| 5,452,231 A * | 9/1995 | Butts et al. | 716/16 |
| 5,551,013 A * | 8/1996 | Beausoleil et al. | 703/23 |
| 5,644,515 A * | 7/1997 | Sample et al. | 703/23 |
| 5,784,600 A * | 7/1998 | Doreswamy et al. | 713/503 |
| 5,903,744 A * | 5/1999 | Tseng et al. | 716/16 |
| 5,951,704 A * | 9/1999 | Sauer et al. | 714/736 |
| 5,963,735 A * | 10/1999 | Sample et al. | 703/24 |
| 6,122,443 A * | 9/2000 | Nishikawa | 716/8 |
| 6,421,251 B1 * | 7/2002 | Lin | 361/788 |
| 6,504,841 B1 * | 1/2003 | Larson et al. | 370/386 |
| 6,618,698 B1 * | 9/2003 | Beausoleil et al. | 703/23 |
| 6,694,464 B1 * | 2/2004 | Quayle et al. | 714/725 |

OTHER PUBLICATIONS

Mak et al. Board-Level Multi-terminal Net Routing for FPGA-based Logic Emulation. 1997 ACM p. 152-167.*
Donath-W.E., Placement and Average Interconnection Lengths of Computer Logic 1979. IEEE p. 272-276.*
IBM. "Machine Organization and Rent's Rule" 1999. p. 1-6.*
U.S. Appl. No. 09/656,147, filed Sep. 6, 2000; Entitled: High Speed Software Driven Emulator Comprised Of A Plurality Of Emulation Processors With An Improved Maintenance Bus That Streams Data At High Speed; W.F. Beausoleil, et al.

(Continued)

*Primary Examiner*—Paul L. Rodriguez
*Assistant Examiner*—Tom Stevens
(74) *Attorney, Agent, or Firm*—Orrick Herrington & Sutcliffe LLP

(57) ABSTRACT

A system and method for determining which of several possible cable lengths has been used by reversing the end-to-end correspondence of at least two conductors in the cable. A different two conductors are selected to identify respective different cable lengths. Each input pin is connected to a correspondingly identified output pin, except for the pair with the outputs reversed, which pair signifies the cable length.

5 Claims, 3 Drawing Sheets

OTHER PUBLICATIONS

U.S. Appl. No. 09/656,541, filed Sep. 6, 2000; Entitled: High Speed Software Driven Emulator Comprised Of A Plurality Of Emulation Processors With A Method To High Speed Bulk Read/Writes Operation Synchronous Dram While Refreshing The Memory; W.F. Beausoleil, et al.

U.S. Appl. No. 09/596,596, filed Sep. 6, 2000; Entitled: High Speed Software Driven Emulator Comprised Of A Plurality Of Emulation Processors With A Method To Allow Memory Read/Writes Without Interrupting The Emulation; W.F. Beausoleil, et al.

U.S. Appl. No. 09/656,146, filed Sep. 6, 2000; Entitled: High Speed Software Driven Emulator Comprised Of A Plurality Of Emulation Processors With Improved Multiplexed Data Memory; W.F. Beausoleil, et al.

* cited by examiner

HIGH SPEED SOFTWARE DRIVEN EMULATOR COMPRISED OF A PLURALITY OF EMULATION PROCESSORS WITH IMPROVED BOARD-TO-BOARD INTERCONNECTION CABLE LENGTH IDENTIFICATION SYSTEM

CROSS REFERENCE TO RELATED APPLICATIONS

The following copending applications, assigned to the assignee of the present invention, contain common disclosure and are incorporated herein by reference in their entireties:

"High Speed Software Driven Emulator Comprised of a Plurality of Emulation Processors with an Improved Bus the Streams Data at High Speeds," Ser. No. 09/656,147, filed Sep. 6, 2000, now U.S. Pat. No. 6,850,880.

"High Speed Software Driven Emulator Comprised of a Plurality of Emulation Processors with a Method to Allow High Speed Bulk Read/Write Operation Synchronous DRAM While Refreshing the Memory," Ser. No. 09/656,541, files Sep. 6, 2000, now U.S. Pat. No. 6,901,359.

"High Speed Software Driven Emulator Comprised of a Plurality of Emulation Processors with a Method to Allow Memory Read/Write Without Interrupting the Emulation," Ser. No. 09/656,596, filed Sep. 6, 2000, now U.S. Pat. No. 6,665,542.

"High Speed Software Driven Emulator Comprised of a Plurality of Emulation Processors with Improved Multiplexed Data Memory," Ser. No. 09/656,146, filed Sep. 6, 2000, now U.S. Pat. No. 7,043,417.

FIELD OF THE INVENTION

The invention relates to software driven emulators comprised of a large number of processors on a module, with a large number of modules on a board, and several boards interconnected by cables of different lengths to comprise the emulator engine. More particularly, the invention relates to a method for determining the cable length used in interconnecting two or more boards.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

The usefulness of software driven emulators has increased enormously with growth in the complexity of integrated circuits. Basically, an emulation engine operates to mimic the logical design of a set of one or more integrated circuit chips. The emulation of these chips in terms of their logical design is highly desirable for several reasons. The utilization of emulation engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well suited to the utilization of emulation engines which are electrically configured to duplicate the same logic function that is provided by a design automation tool.

Utilization of emulation devices permits testing and verification via electrical circuits of logic designs before these designs are committed to a so-called "silicon foundry" for manufacture. The input to such foundries is the functional logic description required for the chip and its output is initially a set of photolithography masks which are then used in the manufacture of the desired electrical circuit chip device. Verifying the logic designs are correct in the early stage of chip manufacturing eliminates the need for costly and time-consuming subsequent passes through a silicon foundry.

Another advantage of emulation systems is that they provide a device that makes possible the early validation of software meant to operate the emulated chips. Thus, software can be designed, evaluated and tested well before the time when actual circuit chips become available. Additionally, emulation systems can also operate as simulator-accelerator devices thus providing a high-speed simulation platform.

Emulation engines of the type contemplated by this invention contain an interconnected array of emulation processors (EP). Each emulation processor (hereinafter also sometimes simply referred to as "processor") can be programmed to evaluate logic functions (for example, AND, OR XOR, NOT, NOR, NAND, etc.). The program-driven processors operate together as an interconnected unit, emulating the entire desired logic design. However, as integrated circuit designs grow in size, more emulation processors are required to accomplish the emulation task. An aim, therefore, is to increase the capacity of emulation engines in order to meet the increasingly difficult task of emulating more and more complex circuits and logic functions by increasing the number of emulation processors in each of its modules.

For purposes of better understanding the structure and operation of emulation devices generally, and this invention particularly, U.S. Pat. No. 5,551,013 and patent application Ser. No. 09/373,125 filed Aug. 12, 1999, both of which are assigned to the assignee of this application, are hereby incorporated herein by reference. The teachings of the pending application improve the basic design of the U.S. Pat. No. 5,551,013 patent by interconnecting processors into clusters.

U.S. Pat. No. 5,551,013, shows an emulation module having multiple (e.g. 64) processors. Multiple modules are mounted on printed circuit boards, and the boards are interconnected by cables. All processors within the module are identical. The sequencer and the interconnection network occurs only once in a module. The control stores hold a program created by an emulation compiler for a specified processor and the stacks hold data and inputs previously generated, which are addressed by fields in a corresponding control word to locate the bits for input to the logic element. During each step of the sequencer, an emulation processor emulates a logic function according to the emulation program. A data flow control interprets the current control word to route and latch data within the processor. The node-bit-out signal from a specified processor is presented to the interconnection network where it is distributed to each of the multiplexers (one for each processor) of the module. The node address field in the control word allows a specified processor to select for its node-bit-in signal the node-bit-out signal from any of the processors within its module. The node bit is stored in the input stack on every step. During any operation the node-bit-out signal of a specified processor may be accessed by none, one, or all of the processors within the module.

A bus connected to the processor output multiplexers enables an output from any emulation processor to be transferred to an input of any other of the emulation processors. As explained in the copending application Ser. No. 10/373,125, now U.S. Pat. No. 6,618,698, clusters of processors are advantageously interconnected as an emulation engine such that the setup and storing of results is done in parallel, while the output of one evaluation unit is made available as the input of the next evaluation unit. For this purpose, processors share input and data stacks, and have a set of 'cascade' connections which provides access to the intermediate values. By tapping 'intermediate' values from one processor, and feeding them to the next, significant emulation speedup is achieved.

At the operating speeds contemplated for the next generation emulator processor chip (ET4), a signal traveling in an interconnecting cable between two printed circuit boards experiences a propagation delay that must be accounted for in the operation of the system. A number of conductors (e.g. 64) are bundled into each cable, with all conductors in a given cable the same length. Each conductor in the cable is connected at one end to the pin or terminal of an input connector and at its other end to a pin or output terminal. The corresponding input and output pins are identified in a sequential order (e.g. input pin 0 is connected to output pin 0, input pin 1 to output pin 1, and so on). In general, a short cable is desirable because the propagation delay is a function of the cable length. However, because of the physical separation of the various boards that must be interconnected, it is advantageous to use cables of more than one length; shorter cables where possible and longer cables where necessary. While the propagation delay for a given cable length is known, in a completely assembled emulator engine, the user can not readily determine the length of the cable that has been used. While there have been proposals in the prior art for determining cable lengths in situ, these prior art methods are inefficient.

SUMMARY OF THE INVENTION

An object of this invention is the provision of an efficient system and method for identifying any one of several possible cable lengths in an emulation engine.

Other objects of the invention are a method of cable identification that is automatic, and not susceptible to human error, and efficient, in that actual data conductors are used for the identification; there is no need for dedicated "ID" conductors, which add cost and waste space.

Briefly, this invention contemplates the provision of a system and method for determining which of several possible cable lengths has been used by reversing the end-to-end correspondence of at least two conductors in the cable. A different two conductors are selected to identify respective different cable lengths. Each input pin is connected to a correspondingly identified output pin, except for the pair with the outputs reversed, which pair signifies the cable length. Note that these so-called "board-to-board" cables can be installed such that they start and end on the same board. This improves intra-board processor connectivity.

In operation, a sequence of code signals are coupled to the cable inputs and the corresponding outputs read out. The inverted output pair is detected and this pair identifies the cable length. The operating program is then compiled and the compiled program accounts for the inverted pair as well as the propagation delay generated by a cable whose length is the same as the identified length.

BRIEF DESCRIPTION OF THE DRAWINGS

The foregoing and other objects, aspects and advantages will be better understood from the following detailed description of a preferred embodiment of the invention, in which.

DETAILED DESCRIPTION OF THE INVENTION

Figure 1:
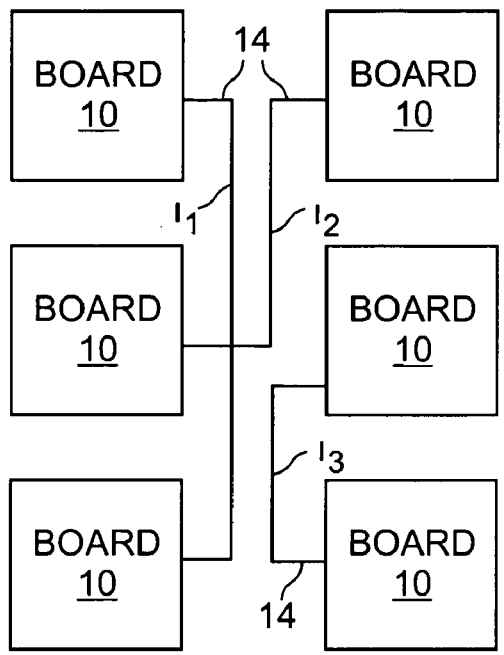
FIG. 1 is a pictorial diagram illustrating emulator boards of an emulator engine whose outputs and inputs are interconnected by multi-conductor cables of various lengths.

Referring now to FIG. 1, as will be appreciated by those skilled in the art, an emulator engine is comprised of a plurality printed circuit boards 10 to each of which is attached a large number of modules (not shown). Each module includes a large number of processors, as explained in the background section of this application and in the patents and patent applications incorporated herein by reference. Multi-conductor cables 14 are used to interconnect signals from one board to another. It is desirable to keep the cable lengths as short as possible. However, toward achieving this goal, more than one cable length is desirable since a short cable needed to connect certain boards would not be long enough to connect others.

Figure 5:
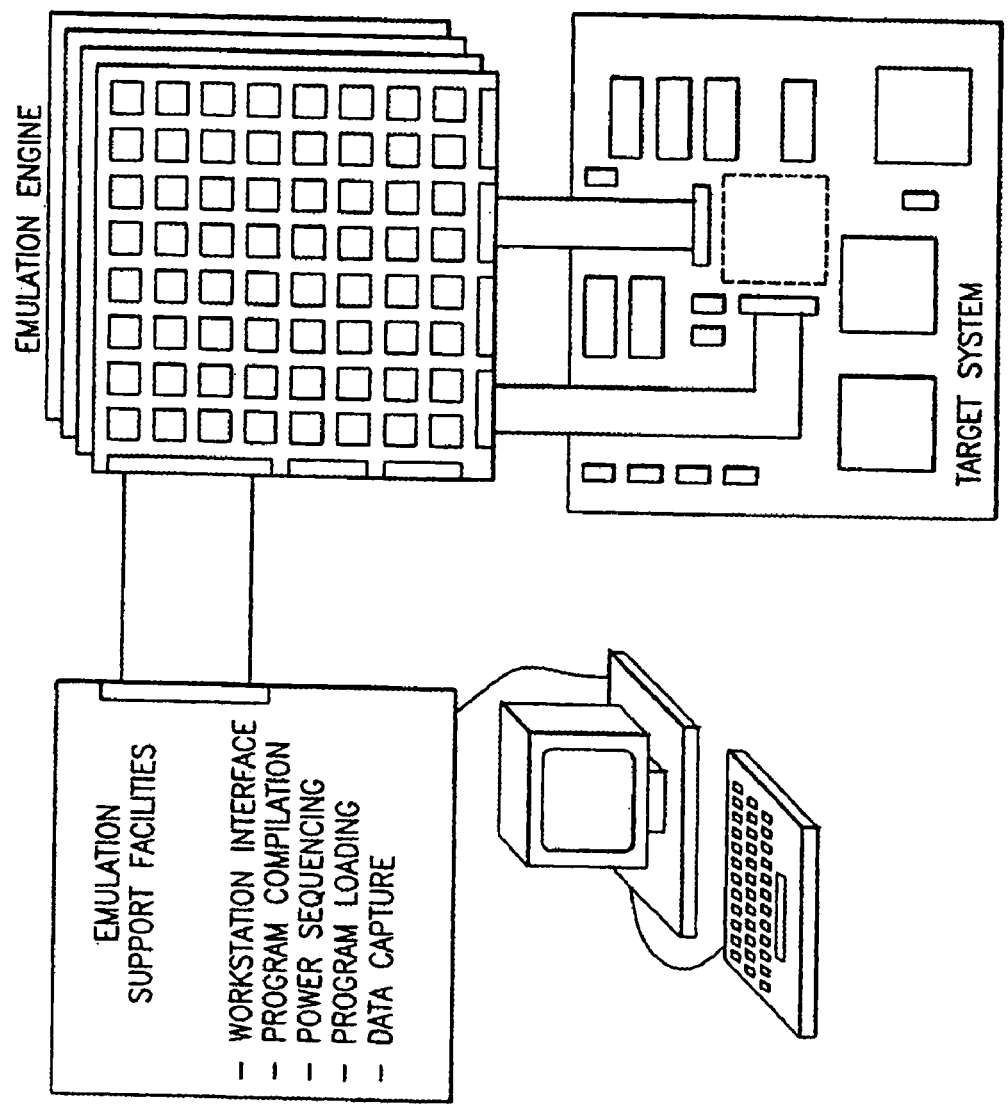
FIG. 5 is an overview of an emulation board.

An emulation system is composed of an emulation engine, the target system, and supporting facilities, as is seen in FIG. 5. Typically the supporting facilities include a control console, an emulation control processor (e.g., personal computer), emulation monitoring and data capturing facilities.

Selected emulation board connector pins on the emulation board(s) comprising the emulation engine are connected through signal interfacing circuits and connectors on a one-for-one basis to the signal pins of the target system. Thus, each input or output signal of the target system is connected to a specified emulation processor output or input signal. Similarly, emulation processors may be connected to the monitoring and data capturing facilities.

Figure 2:
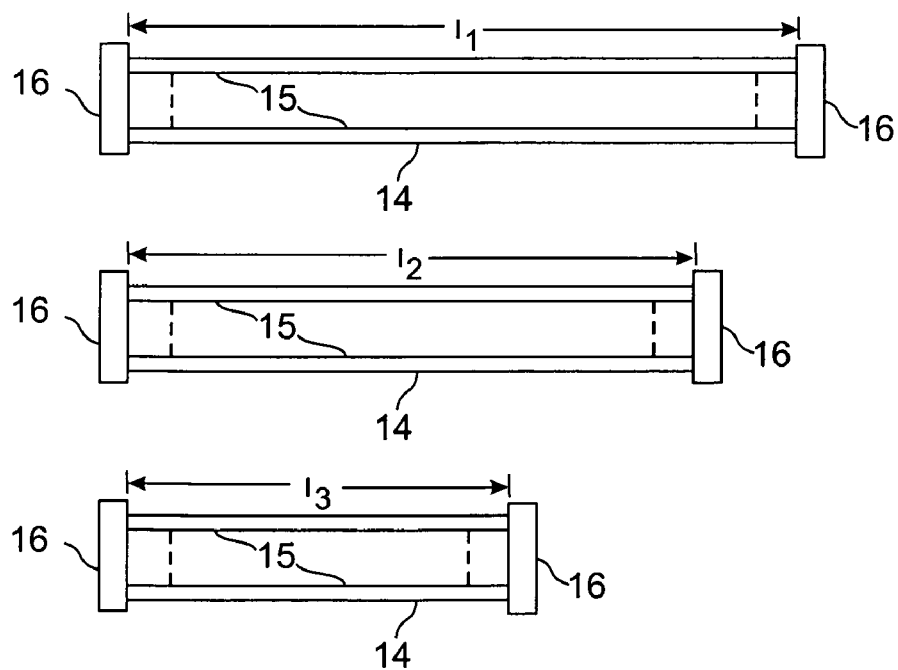
FIG. 2 is a pictoral diagram of three cables of different lengths.

As illustrated in FIG. 2, there is a connector 16 (e.g. a pin type connector) on each end of the cable. In the specific exemplary embodiment of the invention, there are sixty-four conductors 15 all of the same length. As will be apparent to one skilled in the art the invention is applicable generally to multi-conductor cables.

Figure 3:
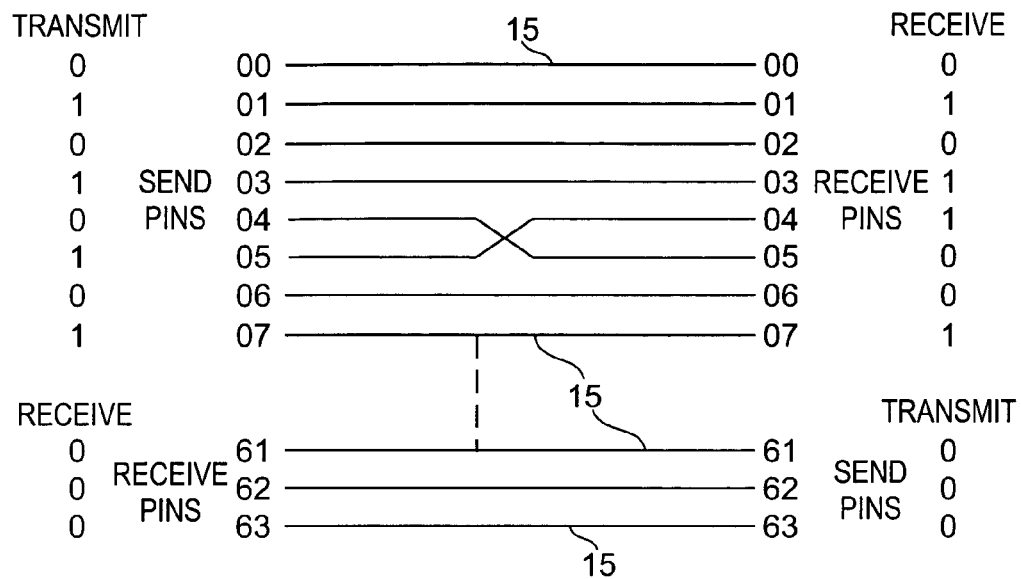
FIG. 3 is a pictoral diagram illustrating the invention.

Referring now to FIG. 3, here the cable has thirty-two "sending" conductors 15 connected to sending pins 00 through 31 of the left-hand connector 16L and connected corresponding receiving pins 00 through 31 of the right-hand connector 16R. It also has thirty-two "receiving" conductors 15 connected to receiving pins 32 through 63 of the left-hand connector 16L and connected to corresponding sending pins 32 through 63 of the right-hand connector 16R. It will be appreciated that the designation sending or receiving to a conductor in cable is not material as far as the cable itself is concerned. With the exception of conductor pairs whose connector pins are interchanged from the pin assignments at one connector relative to the other, the remaining conductors in the cable are "straight through" connections. That is, the individual conductors 15 in the cable connect a pin at one end of the cable to the corresponding pin at the other end of the cable (e.g. left-hand pin 1 connected to right-hand pin 1, pin 9 connected to pin 9, and so on).

In order to identify the length of a cable after it has been installed, the end-to-end connections of at least one pair 20 of conductors is swapped. Swapping different pairs denotes different lengths. For example, the shortest cable may have no conductors swapped. The next shortest may have any two consecutively numbered conductors swapped, and the next shortest after that has two other conductors swapped, and so on. Of course, it is not necessary that the swapped pair be consecutively numbered.

In this illustrative embodiment, the conductor connected to the left-hand sending pin 04 is connected to the right-hand receiving pin 05 and the left-hand sending pin 05 is connected to the right-hand receiving pin 04. The emulator is programmed to couple a binary signal to each input pin in a pattern that will allow detection of a swapped pair and the position of the swapped pair in the sequence (e.g. alternating "1s" and "0s").

The emulator stores the received pattern, which can be read out of storage and analyzed in order to identify the swapped conductors and thus to determine the length of cable to which the pattern was coupled. When an emulation program to be run on the emulator is compiled, the various cable lengths that have been determined is inputted to the compiler, which makes the appropriate adjustments in timing to account for the propagation delay through the cable and also makes the appropriate program adjustment so the swapped conductor pair does not cause an error. It will be appreciated that more than one pair may be swapped, if desired. For example, a pair from the group designated as sending cables and a pair from the group designated as receiving cables.

Figure 4:
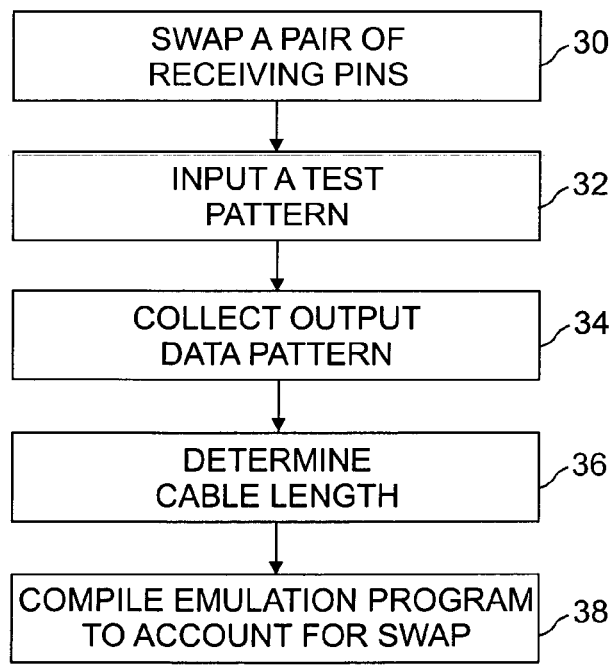
FIG. 4 is a flow chart of the method steps of determining, in accordance with the teachings of the invention, cable length information in an emulation engine.

Referring now to FIG. 4, which summarizes the invention, where the cables of two or more conductor lengths are used to interconnect boards in an emulator engine, at least one pair of receiving pins are physically swapped prior to installation of the cable, block 30. With the cable installed, the emulator is programmed to input a test pattern to the inputs of the cable, block 32. The outputs of the test pattern are collected by the emulator, block 34, and the cable length is determined by detecting the specific swapped pair (or pairs), block 36. The emulation program is compiled for the specific cable length and to account for the swapped output pair or pairs, block 38.

It will also be appreciated that the objects of the invention have been achieved. The method is automatic and not susceptible to human error. The method is also efficient in that actual data conductors are used for identification, so there is no need for dedicated "ID" conductors, which add cost and waste space.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. In hardware logic emulation system that includes at least two printed circuit boards having a plurality of interconnected emulation processor integrated circuits disposed thereon so that the hardware logic emulation system can execute an emulation program corresponding to a logic design, the printed circuit boards being interconnected by a multi-conductor cable with inputs at one end of the cable and corresponding outputs at other cable end, a method for determining length of the cable while the cable is installed in the emulator thereby interconnecting the printed circuit boards, comprising:

prior to installing the cable, interchanging the inputs or outputs of at least one pair of conductors of the multi-conductor cable to denote a cable length;

inputting a test pattern to the cable, said test pattern comprised of binary data;

collecting an output data pattern from the cable that results from the test pattern;

determining the cable length from the output pattern;

compiling an emulation program to account for each interchanged pair of conductors, the emulation program corresponding to a logical design for an integrated circuit.

2. The method for determining the length of the cable as in claim 1 wherein said test pattern is a pattern of alternating binary "1s" and "0s."

3. The method for determining the length of the cable as in claim 1 wherein one cable length is denoted by having no interchanged pair of conductors.

4. The method for determining the length of the cable as in claim 2 wherein one cable length is denoted by having no interchanged pair of conductors.

5. A method for determining length of a multi-conductor cable installed in hardware logic emulation system, the emulation system having a first printed circuit board having a plurality of interconnected emulation processor integrated circuits disposed thereon electrically communicating with a second printed circuit board having a plurality of interconnected emulation processor integrated circuits disposed thereon via the multi-conductor cable so that the hardware logic emulation system can execute an emulation program corresponding to a logic design, the multi-conductor cable having a plurality of inputs at one end and a corresponding plurality of outputs at the other end, comprising:

prior to installing the cable, interchanging the inputs or outputs of at least one pair of conductors of the multi-conductor cable to denote a cable length;

inputting a test pattern to the cable, said test pattern comprised of binary data;

collecting an output data pattern from the cable that results from the test pattern;

determining the cable length from the output pattern;

compiling the emulation program so that the interchanged pair of conductors is accounted for when the emulation program is run on the emulation system.

* * * * *